United States Patent
Aebi

(10) Patent No.: US 6,657,178 B2
(45) Date of Patent: Dec. 2, 2003

(54) ELECTRON BOMBARDED PASSIVE PIXEL SENSOR IMAGING

(75) Inventor: Verle W. Aebi, Menlo Park, CA (US)

(73) Assignee: Intevac, Inc., Santa Clara, CA (US)

( * ) Notice: Subject to any disclaimer, the term of this patent is extended or adjusted under 35 U.S.C. 154(b) by 196 days.

(21) Appl. No.: 09/784,621

(22) Filed: Feb. 14, 2001

(65) Prior Publication Data

US 2001/0017344 A1 Aug. 30, 2001

Related U.S. Application Data

(63) Continuation-in-part of application No. 09/356,800, filed on Jul. 20, 1999, now Pat. No. 6,285,018.

(51) Int. Cl.[7] .................................................. H01J 40/14
(52) U.S. Cl. .................................. 250/214 VT; 313/524
(58) Field of Search ...................... 250/207, 214 VT, 250/342; 348/216.1, 217.1; 313/524; 358/110, 111

(56) References Cited

U.S. PATENT DOCUMENTS

| | | | |
|---|---|---|---|
| 3,465,293 A | | 9/1969 | Weckler |
| 4,471,378 A | * | 9/1984 | Ng .............................. 358/110 |
| 4,631,417 A | | 12/1986 | Brilman |
| 4,687,922 A | | 8/1987 | Lemonier et al. |
| 4,760,031 A | | 7/1988 | Janesick |
| 4,822,748 A | | 4/1989 | Janesick et al. |
| 5,268,612 A | | 12/1993 | Aebi et al. |
| 5,345,266 A | | 9/1994 | Denyer |
| 5,373,320 A | | 12/1994 | Johnson et al. |
| 5,374,826 A | | 12/1994 | LaRue et al. |
| 5,475,227 A | | 12/1995 | LaRue |
| 5,521,639 A | | 5/1996 | Tomura et al. |
| 5,614,744 A | | 3/1997 | Merrill |
| 5,625,210 A | | 4/1997 | Lee et al. |
| 5,631,704 A | | 5/1997 | Dickinson et al. |
| 5,721,425 A | | 2/1998 | Merrill |
| 5,739,562 A | | 4/1998 | Ackland et al. |
| 5,789,774 A | | 8/1998 | Merrill |
| 6,333,205 B1 | * | 12/2001 | Rhodes ..................... 438/69 |
| 6,448,545 B1 | * | 9/2002 | Chen ................... 250/214 VT |

OTHER PUBLICATIONS

Fossum, E. R., CMOS Image Sensors:Electronic Camera-on–A–Chip, IEEE Transactions on Electronic Devices, vol. 44, No. 10, pp 1689–1698 (1997).

Aebi et al., Gallium Arsenide Electron Bombarded CCD Technology, SPIE vol. 3434, pp. 37–44 (1998).

\* cited by examiner

*Primary Examiner*—Stephone Allen
(74) *Attorney, Agent, or Firm*—Stanley Z. Cole

(57) ABSTRACT

A low light level image directed to a photocathode in a vacuum causes release of electron which bombard a CMOS imager including passive pixel sensors which in turn generates an electronic image which is fed out of the vacuum and is used to create useful images corresponding to the low level input image. A camera and other low light imaging devices are described.

30 Claims, 3 Drawing Sheets

ELECTRON BOMBARDED PASSIVE PIXEL SENSOR IMAGING

This is a continuation in part of a application filed Jul. 20, 1999, entitled Electron Bombarded Active Pixel Sensor, Ser. No. 09/356,800, invented by Aebi et al., and now issued as U.S. Pat. No. 6,285,018 B1.

FIELD OF THE INVENTION

This invention relates to devices and methods to image or detect useful images at low light levels utilizing passive pixel sensors in an electron bombarded mode using a photocathode for detection or imaging at low light levels.

BACKGROUND OF THE INVENTION

The copending parent application is directed to the use of active pixel sensors in creating images, particularly of low light level subjects. Active pixel sensor devices comprise a structure or system in which there is gain associated with each pixel in the production of viewable images. Although the use of active pixel sensors enables the production of images from very low light sources or the production of image frames at speeds extending present day capabilities of imaging at low light levels, the use of passive pixel sensors improves upon the sensitivity of certain active pixel sensor systems and thus can produce improved performance in certain low light level conditions. In imaging in which electrons strike the front surface of the pixel, those striking the surface of an active pixel sensor must pass through more transistors to be recognized as compared to the number of transistors encountered in a passive system. This is meaningless if the losses that occur are not important. However, in those systems where each electron is important to the final result and bombardment occurs at the front surface, then a passive system is likely to show less loss as compared to an active one. On the other hand if the amplification of the incoming bombarding electrons is more important to the results than the losses that may be incurred, then an active pixel sensor is to be preferred.

Additionally the use of passive pixel sensors simplifies the making or manufacture of the resulting system. These advantages will become more apparent as this invention is fully discussed hereinafter. For a complete understanding and discussion of the use of active pixel sensor systems, there is incorporated herein by reference the disclosure appearing in Ser. No. 09/356,800, the parent of this application.

Cameras that operate at low light levels have a number of significant applications in diverse areas. These include, among others, photographic, night vision, surveillance, and scientific uses. Modern night vision systems, for example, are rapidly transforming presently used direct view systems to camera based arrangements. These are driven by the continued advances in video display and processing. Video based systems allow remote display and viewing, recording, and image processing including fusion with other imagery such as from a forward looking infra-red sensor. Surveillance applications are also becoming predominately video based where camera size, performance, and low light level sensitivity are often critical. Scientific applications require cameras with good photon sensitivity over a large spectral range and high frame rates. These applications, and others, are driving the need for improved low light level sensors with the capability of a direct video output.

Image sensing devices which incorporate an array of image sensing pixels are commonly used in electronic cameras. Each pixel produces an output signal in response to incident light. The signals are read out, typically one row at a time, to form an image. Cameras in the art have utilized Charge Coupled Devices (CCD) as the image sensor. Image sensors which incorporate an amplifier into each pixel for increased sensitivity are known as active pixel sensors (sometimes referred to herein as APS). Image sensors without an amplifier incorporated in each pixel are known as passive pixel sensors (sometimes referred to herein as PPS). Both APS and PPS imagers belong to the general family of image sensing devices known as CMOS imagers. Active pixel sensors are disclosed, for example in U.S. Pat. No. 5,789,774 issued Aug. 4, 1998 to Merrill; U.S.Pat. No. 5,631,704 issued May 20, 1997 to Dickinson et al; U.S. Pat. No. 5,521,639 issued May 28, 1996 to Tomura et al; U.S. Pat. No. 5,721,425 issued Feb. 24, 1998 to Merrill; U.S. Pat. No. 5,625,210 issued Apr. 29,1997 to Lee et al; U.S. Pat. No. 5,614,744 issued Mar. 25, 1997 to Merrill; and U.S. Pat. No. 5,739,562 issued Apr. 14, 1998 to Ackland et al. Passive pixel sensors are disclosed, for example in U.S. Pat. No. 3,465,293 to Weckler; U.S. Pat. No. 4,631,417 to Brilman; and U.S. Pat. No. 5,345,266 to Denyer. Extensive background on passive and active pixel sensor devices is contained in the paper by Fossum, "CMOS Image Sensors: Electronic Camera-On-A-Chip", IEEE Transactions on Electron Devices, Vol. 44, No. 10, pp. 1689–1698, (1997) and the references therein.

In general, it is desirable to provide cameras which generate high quality images over a wide range of light levels including extremely low light levels such as those encountered under starlight and lower illumination levels. In addition, the camera should have a small physical size and low electrical power requirements, thereby making portable, head-mounted, and other battery-operated applications practical. CMOS image sensor cameras (both APS and PPS) meet the small size and low power requirements, but have poor low light level sensitivity with performance limited to conditions with 0.1 lux (twilight) or higher light levels. Generally APS image sensors have greater sensitivity than PPS image sensors due to the inclusion of amplification in each pixel but amplification, as discussed above requires more transistors per pixel which in turn can result in more photon losses for optical imagers and electron losses for electron sensitive CMOS imagers, which can destroy utility for some applications.

Night vision cameras which operate under extremely low light levels are known in the art. The standard low light level cameras in use today are based on a Generation-III (GaAs photocathode) or Generation-II (multi-alkali photocathode) image intensifier fiber optically coupled to a CCD to form an Image Intensified CCD or ICCD camera. The scene to be imaged is focused by the input lens onto the photocathode faceplate assembly. The impinging light energy liberates photoelectrons from the photocathode to form an electron image. The electron image may, for example, be proximity focused onto the input of the microchannel plate (MCP) electron multiplier, which intensifies the electron image by secondary multiplication while maintaining the geometric integrity of the image. The intensified electron image may also be proximity focused onto a phosphor screen, which converts the electron image back to a visible image, which typically is viewed through a fiber optic output window. A fiber optic taper or transfer lens then transfers this amplified visual image to a standard CCD sensor, which converts the light image into electrons which form a video signal. In these existing prior art ICCD cameras, there are five interfaces at which the image is sampled, and each interface degrades the resolution and adds noise to the signal of the ICCD camera. This image degradation which has heretofore not been avoidable, is a significant disadvantage in systems requiring high quality output. The ICCD sensor tends also to be large and heavy due to the fused fiber optic components. A surveillance system having a Generation-III MCP image intensifier tube is described, for example, in U.S. Pat. No. 5,373,320 issued Dec. 13, 1994 to Johnson et al. A camera attachment described in this patent converts a standard daylight video camera into a day/night video camera.

In addition to image degradation resulting from multiple optical interfaces in the ICCD camera a further disadvantage is that the MCP is a relatively noisy amplifier. This added noise in the gain process further degrades the low light level image quality. The noise characteristics of the MCP can be characterized by the excess noise factor, Kf. Kf is defined as the ratio of the Signal-to-Noise power ratio at the input of the MCP divided by the Signal-to-Noise power ratio at the output of the MCP after amplification. Thus Kf is a measure of the degradation of the image Signal-to-Noise ratio due to the MCP gain process. Typical values for Kf are 4.0 for a Generation-III image intensifier. A low noise, high gain, MCP for use in Generation-III image intensifiers is disclosed in U.S. Pat. No. 5,268,612 issued Dec. 7, 1993 to Aebi et al.

An alternate gain mechanism is achieved by the electron-bombarded semiconductor (sometimes referred to herein as EBS) gain process. In this gain process, gain is achieved by electron multiplication resulting when the high velocity electron beam dissipates its energy in a semiconductor. The dissipated energy creates electron-hole pairs. For the semiconductor silicon one electron-hole pair is created for approximately every 3.6 electron-volt (eV) of incident energy. This is a very low noise gain process with Kf values close to 1. A Kf value of 1 would indicate a gain process with no added noise.

The electron-bombarded semiconductor gain process has been utilized in a focused electron bombarded hybrid photomultiplier tube comprising a photocathode, focusing electrodes and a collection anode comprising a semiconductor diode disposed in a detector body as disclosed in U.S. Pat. No. 5,374,826 issued Dec. 20, 1994 to LaRue et al. and U.S. Pat. No. 5,475,227 issued Dec. 12, 1995 to LaRue. The disclosed hybrid photomultiplier tubes are highly sensitive but do not sense images.

The electron-bombarded semiconductor gain process has been used to address image degradation in the ICCD low light level camera. A back illuminated CCD is used as an anode in proximity focus with the photocathode to form an Electron Bombarded CCD (EBCCD). Photoelectrons from the photocathode are accelerated to and imaged in the back illuminated CCD directly. Gain is achieved by the low noise electron-bombarded semiconductor gain process. The EBCCD eliminates the MCP, phosphor screen, and fiber optics, and as a result both improved image quality and increased sensitivity can be obtained in a smaller sized camera. Significant improvement of the degraded resolution and high noise of the conventional image transfer chain has been realized with the EBCCD. An EBCCD is disclosed in U.S. Pat. No. 4,687,922 issued Aug. 18, 1987 to Lemonier. Extensive background on EBCCDs is contained in the paper by Aebi, et al, "Gallium Arsenide Electron Bombarded CCD Technology", SPIE Vol. 3434, pp. 37–44, (1998) and references cited therein.

Optimum low light level EBCCD performance requires a specialized CCD. The CCD is required to be backside thinned to allow high electron-bombarded semiconductor gain. The CCD cannot be used in a frontside bombarded mode as used in a standard CCD camera as the gate structures would block the photoelectrons from reaching the semiconductor and low electron-bombarded semiconductor gains would be obtained at moderate acceleration voltages. High acceleration voltages required to penetrate the gate structures would cause radiation damage to the CCD and shorten CCD operating life. Also a frame transfer format is required where the CCD has both an imaging region and a store region on the chip. The image and store regions are of approximately the same size. A frame transfer format is required for two reasons. First it is essential that the CCD imaging area have high fill factor (minimum dead area) if possible. The frame transfer CCD architecture satisfies this requirement. The interline transfer CCD architecture would result in substantial dead area (of order 70–80%). Any reduction in active area will result in lost photoelectrons. This is equivalent to a reduction in photocathode quantum efficiency or sensitivity. At the lowest light levels (starlight or overcast starlight), low light level camera performance is dictated by the photon statistics. It is essential that the maximum number of photons be detected by the imager for adequate low light level resolution and performance. Second a frame transfer format allows signal integration to occur during the readout of the store region in addition to any integration period. This allows charge to be integrated almost continuously maximizing the collected signal.

EBCCD cameras have several disadvantages. The frame transfer CCD architecture has the serious disadvantage for the EBCCD application of essentially doubling the size of the required vacuum envelope due to the requirement for image and store regions on the CCD. This requirement also means that the frame transfer CCD chip is more than twice the size of the image area. This substantially increases the cost of the CCD relative to interline transfer CCDs or active or passive pixel sensor chips as fewer chips can be fabricated per silicon wafer. EBCCD based cameras also have the disadvantage of backside illumination of the CCD which necessitates specialized processing to thin the semiconductor and passivate the back surface for high electron-bombarded semiconductor gain. This processing is not standard in the silicon industry and substantially increases the EBCCD manufacturing cost. The EBCCD cameras consume several watts of power due to the CCD clocking requirements and require external electronics for a complete camera. The size of the external camera electronics presents an obstacle to applications that would benefit from miniaturization of the camera. Finally CCDs require specialized semiconductor processing lines which are not compatible with mainstream CMOS semiconductor fabrication technology. This further increases the cost of CCD based cameras.

SUMMARY OF THE INVENTION

It is the object of the present invention to further improve upon these various disadvantages in the prior art and provide improved low light level imaging systems and corresponding processes using a passive pixel sensor. This may be achieved by utilizing a passive pixel sensor CMOS imager in an electron bombarded mode in a vacuum envelope with a photocathode sensor. The electron bombarded passive pixel sensor constitutes a complete low light level camera with the addition of a lens, housing, power, and a control interface.

It is accordingly another object of this invention to describe an improved low light level camera which makes use of a passive pixel sensor CMOS imager and direct electron bombardment.

It is yet another object of this invention to describe a novel chip or imaging circuit to facilitate the creation of lightweight structures when this imaging circuit employing passive pixel sensors is used which considerably reduces power requirements and enables improved devices for various and select low light level imaging applications.

Further features and embodiments of the present invention will become more apparent from the following detailed description when read in conjunction with the accompanying drawings.

DETAILED DESCRIPTION OF THE INVENTION

Figure 1:
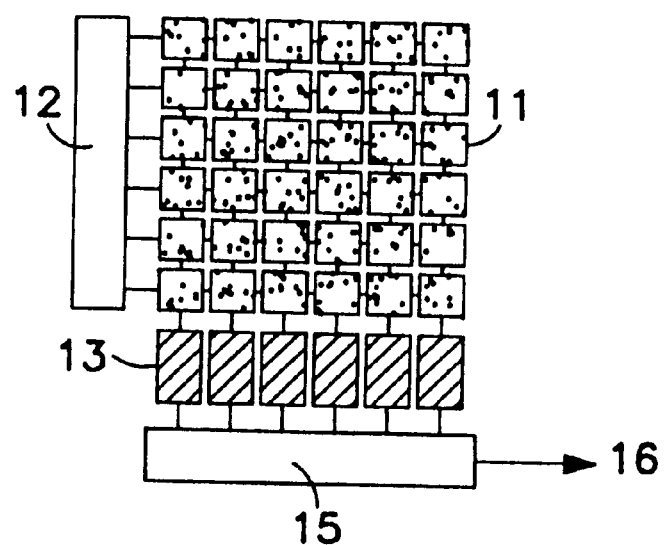
FIG. 1 is a schematic illustration of the architecture of a CMOS image sensor chip.

A CMOS image chip is illustrated in FIG. 1. The architecture of a passive pixel sensor is shown in FIG. 2.

Referring now to FIG. 1, there is shown a pixel array 11 controlled by a logic timing and control circuit 12. The pixel array is, in this instance, comprised of an array of passive pixel sensors. Signals are processed by signal processors 13 which may comprise an analog signal processor and analog to digital converters. A column select control circuit is illustrated as 15 and the output signal is shown feeding from the pixel sensor array by an arrow designated 16. The output at 16 may comprise a digital or analog signal depending on the system in which the pixel sensor is being used or to which the signal is being fed.

Figure 2:
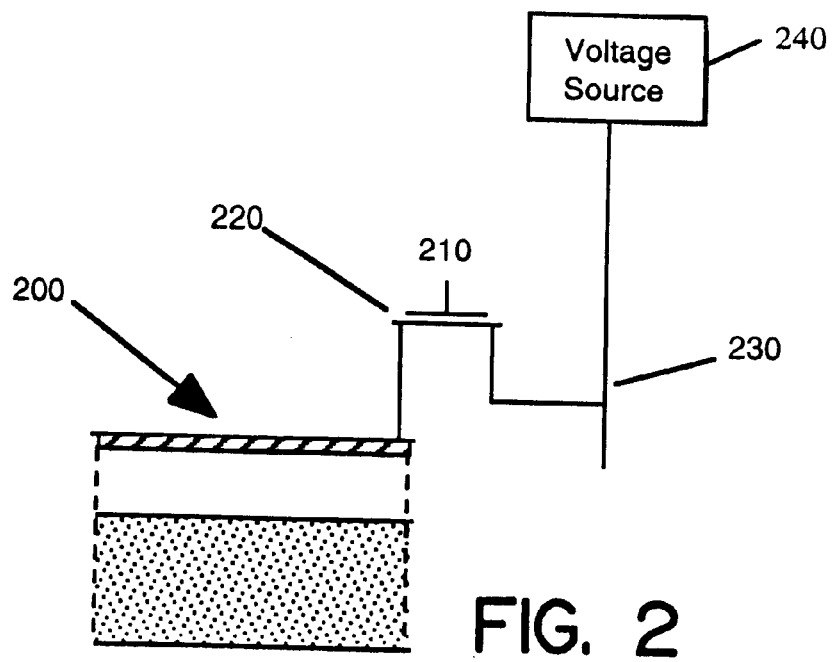
FIG. 2 is a schematic illustration of the architecture of a typical passive pixel sensor.

The pixel architecture used to form the individual pixels in pixel array 11 comprises a passive pixel structure discussed more fully in connection with FIG. 2.

In FIG. 2 there is illustrated a passive pixel structure. The photoelectrons generated by the incident photon flux are collected on photodiode 200. Photodiode 200 has been reverse biased by the voltage source 240 applied to column bus 230 which is applied when gate 210 of the normally off pass transistor 220 is pulsed by a voltage source to turn the transistor on and set the photodiode bias to the column bus voltage. The photogenerated charge is also sensed when the pass transistor 220 is turned on by applying a voltage pulse to transistor gate 210. Timing and control of the voltage source is performed by a logic timing and control circuit 12 as is illustrated in FIG. 1. The charge is amplified and the signal converted to a voltage by a charge integrating amplifier connected to column bus 230 as part of the analog signal processing circuit 13 (see FIG. 1) connected to the column bus 230.

CMOS image sensor based cameras have significant advantages over charge coupled device based cameras. These advantages include: substantially higher levels of electronics integration with the majority of the required camera electronics integrated on the CMOS image sensor (either APS or PPS) chip where the electronics include integrated timing and control electronics; an order of magnitude or greater reduction in power requirements; use of low cost standard CMOS fabrication technology; substantial overall reduction in camera volume; and versatile image readout. Image readout modes can include window readout of subregions of the overall array or skip readout where every $n^{th}$ pixel is readout (n being an integer). In both of these modes only a fraction of the pixels are readout enabling higher frame rates.

Figure 3:
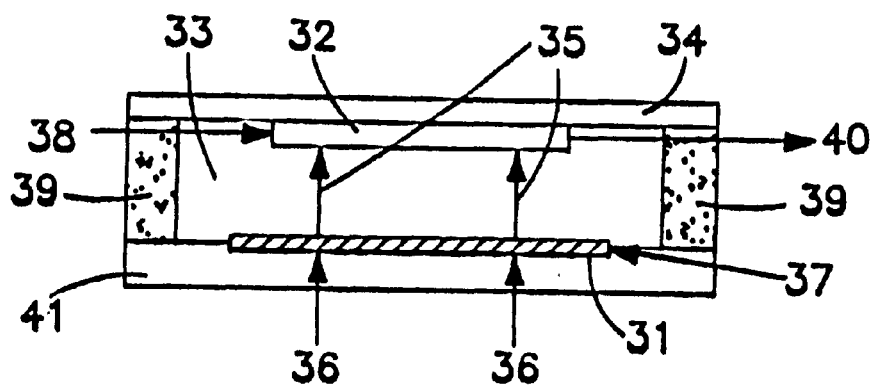
FIG. 3 is a schematic illustration showing an electron bombarded passive pixel sensor in a vacuum tube arrangement in accordance with the present invention.

Referring now to FIG. 3, there is shown an electron bombarded CMOS image sensor vacuum system or tube 33 in accordance with this invention. This system may comprise photocathode 31 (preferably a III–V semiconductor photocathode such as GaAs or an InP/InGaAs Transferred Electron photocathode for high performance applications or a multi-alkali photocathode for lower cost and performance applications) in proximity focus with a specialized CMOS image sensor chip 32 which forms the anode of tube 33. Photoelectrons 35 are emitted from photocathode 31 in response to incident light illustrated as arrows designated 36. These electrons are transferred by an applied voltage. Typically the acceleration voltage 37 applied to photocathode 31 is negative with respect to the chip. This permits biasing of the chip to near ground potential for easy interfacing with other components. Control signals and bias voltages 38 are applied to the CMOS image sensor chip 32 and a video output signal 40 may be taken off sensor 32. The base of tube 33 in FIG. 3 is a transparent faceplate 41 and tube sidewalls 39 extend between the transparent faceplate 41 on which the photocathode 31 is positioned and header assembly 34, on which the CMOS imager chip is positioned. The header assembly 34, also provides means for electrical feedthroughs for applying voltage 38 to the CMOS imager chip and for video output signals 40 from the chip.

The CMOS image sensor for this application is modified for electron sensitivity using the electron-bombarded semiconductor mechanism. The preferred embodiment is a front side electron bombarded mode to eliminate the requirement for backside thinning and passivation of the CMOS image sensor chip. The front side electron bombarded approach will result in the lowest cost electron bombarded CMOS image sensor component. However, it is important that low light level performance not be significantly compromised with this approach. This implies that the photodiode occupies a substantial percentage of the pixel area to allow a high pixel fill factor. Fill factors in excess of 50% are desirable for good low light level performance. A 50% fill factor would result in an equivalent low noise sensitivity for the electron bombarded CMOS image sensor to an image intensifier CCD system using a Generation-IIII image intensifier.

A front side electron bombarded CMOS imager preferably uses a passive pixel structure as this results in the highest fill factor for a given CMOS process as only one transistor is required per pixel. This large fill factor allows potentially greater sensitivity in a CMOS image sensor with this approach versus the active pixel sensor designs. Also for a given required sensitivity level the passive pixel sensor system can obtain this with a smaller pixel size than if the active pixel sensor approach were followed. This enables a higher resolution CMOS Imager to be fabricated. This is not realized in practice for direct detection of photons as the passive pixel structure results in much higher read noise (two to three times higher) than is obtained in an active pixel design where amplification of the detected signal occurs in each pixel. This high read noise with the passive pixel design has resulted in use of this approach in low performance applications only. The situation is much different in the electron bombarded CMOS image sensor application. In this case the addition of low noise EBS gain prior to the CMOS readout noise mitigates the greater read noise with the passive pixel approach. Overall electron bombarded CMOS image sensor performance is now dominated by the photodiode fill factor.

This advantage can be directly evaluated by examining the signal-to-noise ratio (SNR) performance of the electron bombarded CMOS imager as a function of fill factor (ff), photocathode quantum efficiency (QE), photon flux incident on the photocathode (ø), EBS gain (G), and CMOS imager read noise (σ). The per pixel SNR of the electron bombarded CMOS imager is given by the following equation:

$$SNR = ff \times QE \times \phi / sqrt(ff \times QE \times \phi + \sigma^2/G^2)$$

It can be seen by examination of the equation that large EBS gain mitigates the CMOS imager read noise. SNR is proportional to the square root of the fill factor. Larger fill factor directly increases SNR allowing the passive pixel design with its larger fill factor to result in higher SNR performance than can be obtained with a front side bombarded active pixel sensor CMOS imager as only one transistor is required per pixel. This large fill factor allows potentially greater sensitivity in a CMOS image sensor with this approach versus one using active pixel sensor designs.

The photodiode as illustrated in FIG. 2 is desired to have high electron-bombarded semiconductor gain at relatively low electron acceleration voltages (preferably less than 2,000 volts). This minimizes radiation damage to the CMOS imager due to x-rays generated by electron bombardment of the silicon or overlying structures on the CMOS image sensor chip. Low voltage operation is also desirable to enable easy gating of the tube by control of the applied voltage. Furthermore it is desirable to shield adjacent CMOS circuitry from the electron bombardment by providing an overlying protective layer with conductivity to allow any charge accumulation to be drained, preventing damage due to electrostatic discharge. The shielding also reduces x-ray dose to the underlying CMOS circuitry.

High electron-bombarded semiconductor gain at low electron acceleration voltages requires elimination of any overlayers from the photodiode surface and good passivation of the semiconductor surface to minimize carrier recombination at the surface. This passivation can be achieved by a number of techniques known to the art. One standard technique is to form a thin doped region at the semiconductor surface. The thickness of this doped region is desired to be less than or equal to the electron range in the solid, preferably substantially less, at the desired operating voltage. For operation at 2,000 volts the electron range is approximately 600 Å for silicon. The approximate electron range in a solid is given by $R_G$ the Gruen range where $$R_G = 400 E_b^{1.75}/\rho$$

$R_G$ is in angstroms, $E_b$ is in keV and $\rho$ is in gm/cm$^3$. For silicon the bulk density, $\rho$ is 2.33 g/cm$^3$.

The doped region is doped to have a greater free carrier concentration of the same carrier type than the underlying region. This increase in doping concentration forms a potential barrier which prevents the desired minority carriers from reaching the surface where they could recombine and not be collected by the reverse biased photodiode. Other techniques to form a potential barrier to prevent minority carriers from reaching the surface are known in the art. Passivation techniques are disclosed, for example, in U.S. Pat. No. 4,822,748 issued Apr. 18, 1989 to Janesick et al; and in U.S. Pat. No. 4,760,031 issued Jul. 26, 1988 to Janesick.

An alternate embodiment of this invention utilizes a backside bombarded CMOS image sensor chip. In this embodiment the CMOS imager chip is mounted face down and the silicon substrate is mechanically and chemically removed leaving a thinned CMOS image sensor chip.

A disclosure of how to thin the substrate in connection with CCDs appears in U.S. Pat. No. 4,687,922. This described method may also be used to thin the backside of a CMOS image chip structure and is incorporated herein by reference. In general back-thinning may be accomplished by thinning the substrate under sensitive areas.

Figure 4:
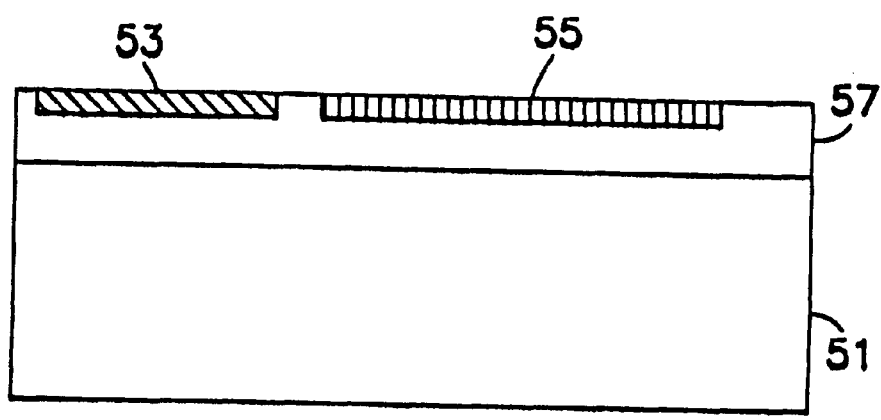
FIG. 4 is a cross sectional view of a photodiode pixel structure.

A cross section of a photodiode pixel structure is illustrated in FIG. 4 prior to thinning of the substrate. The photodiode, 200 in FIG. 2, is indicated as region 55 in FIG. 4. The CMOS circuitry composed of the associated pass transistor in the pixel (transistor 220 in FIG. 2) is contained in region 53. First a rapid isotropic etching step is performed to remove a major portion of substrate 51. For example, if the substrate is approximately 400 μm initially, this etch step will proceed until approximately 380 μm of the substrate layer 51 has been etched away leaving a thin layer of approximately 20 μm of substrate material. This etch step is performed with the aid of a solution of nitric acid, acetic acid and hydrofluoric acid in proportions of 5:3:3 or through the use of similar solutions known in the art. By rotating the substrate during this etch a final thickness of good consistency will be produced. A slow etch is then carried out in order to remove the remaining substrate material, stopping the etch in layer 57. This leaves a layer which is on the order of 5 μm thick. This etch is done with the aid of a solution of nitric acid, acetic acid and hydrofluoric acid in proportions of 3:8:1, in the presence of hydrogen peroxide in the ratio of 5 ml per 350 ml of acid solution or using similar solutions known in the art. Doping differences between layers 57 and 51 are utilized to obtain etch selectivity. Etching is performed to assure good uniformity in thickness. After thinning of the CMOS image sensor the back surface is passivated to reduce the surface recombination velocity and ensure high electron bombarded gain at low operation voltages (<2 kV).

Substrate removal and backside passivation enables the photons and photoelectrons to be absorbed at a point sufficiently close to the source of potential and charge collection which in this embodiment is performed with a reverse biased photodiode to allow charges created to reach their destinations without bulk or surface recombination or lateral diffusion.

In the exposure mode, electrons from the photocathode are incident on the back face of the chip, similar to the case for the previously described EBCCD. Although this approach requires additional processing to mount and thin the PPS chip, advantages are that 100% fill factor may be obtained as no intervening structures are on the electron bombarded surface and potentially all of the incident photoelectrons may be detected by building in the appropriate electrostatic potential distribution into the solid by manipulation of doping profiles in ways known in the art. The potential distribution in layer 57 can be structured to deflect the generated electrons away from the CMOS circuitry to the photodiode. This allows the ultimate in low light level sensitivity.

An alternate embodiment of this invention utilizes a frontside bombarded CMOS image sensor chip coated with an electron-to-light conversion layer. This is now discussed in connection with FIG. 5 hereof.

Figure 5:
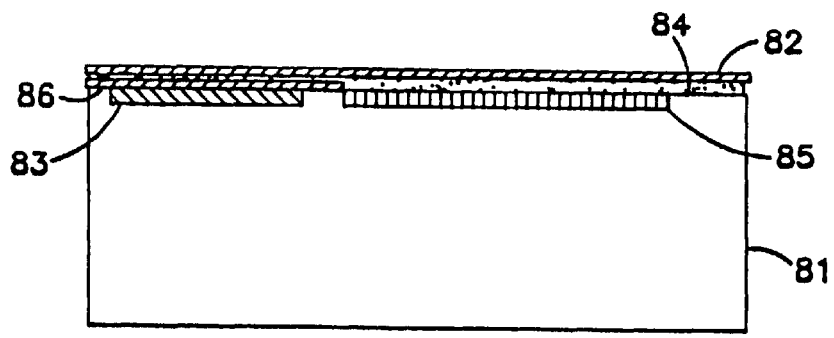
FIG. 5 is a schematic illustration of a passive pixel sensor with an overlying light conversion layer; and, FIG. 6 is an showing of an imaging system or camera illustrating an application of this invention.

This approach has the advantage of utilizing standard chips which have not been modified for direct electron sensitivity. A CMOS image sensor of this type is shown in FIG. 5. Referring now to FIG. 5, there is shown a cross section of a passive pixel sensor with a front side electron-to-light conversion layer. The photodiode (200 in FIG. 2) is indicated as region 85 in FIG. 5. The CMOS circuitry comprising the associated pass transistor in the pixel (transistor 220 in FIG. 2) is contained in region 83. These structures are contained in substrate 81. An optical shield layer 86, is used to block light generated in electron-to-light conversion layer 84 from entering region 83. Layer 86 may be fabricated from aluminum or other highly reflective metal to allow generated light to be reflected back into the light conversion layer where further reflections may result in the light reaching region 85 where it will be detected by the photodiode structure. The light conversion layer, 84, is coated with an optically reflective, electrically conductive layer 82. Layer 82 forms a conductive anode layer for the electron bombarded pixel sensor and allows the incident electrons to be collected and to drain off to the tube bias voltage supply. Layer 82 also blocks light generated in layer 84 from reaching the photocathode. If light from this layer reached the photocathode it would result in optical feedback and would add excess noise to the detected image. Typically layer 82 must attenuate light reaching the photocathode from layer 84 by at least three orders of magnitude or more to minimize optical feedback effects.

In this embodiment a standard CMOS image sensor chip may be used with application of the electron-to-light conversion layer and associated structure shown in FIG. 5. Electrons accelerated from the cathode to anode are converted to photons by the conversion layer which are detected by the CMOS image sensor pixel. This screen would be deposited directly on the CMOS image sensor chip. In this approach layer 82 would be fabricated using aluminum which has the properties of good optical reflectivity and good electron transmission at relatively low incident electron energies. Optical reflectivity is important to allow more of the generated light to reach the photodiode for greater sensitivity. In this case light which strikes layer 82 may be reflected back to the pixel and be detected, increasing screen efficiency. Layer 84 may be fabricated using high efficiency phosphors such as P20 or P43, which emit in the green. Further optimization may be done by choosing a phosphor that emits light with a wavelength which matches the peak sensitvity wavelength of the CMOS image sensor. The conversion layer may comprise a standard metallized phosphor screen of the type known in the art.

Disadvantages of the approach using a conversion layer at the surface are lower resolution and higher noise as compared to the direct detection of electrons by the CMOS image sensor chip. Lower resolution results from light scattering in the light conversion layer which will result in pixel-to-pixel cross talk, reducing the modulation transfer function. Higher noise results from degradation in the excess noise factor due to the additional conversion step now incorporated with the light conversion screen. Higher noise will also result as the electron acceleration voltage will need to be substantially higher to achieve good overall conversion gain. This is due to inefficiency in the light conversion layer which typically requires voltages greater than 4 kV for good conversion efficiency. The high acceleration voltage will greatly increase the x-ray generation rate. X-rays detected by the photocathode will result in large noise pulses. The x-rays may also significantly shorten the pixel sensor chip lifetime due to radiation damage effects. Optimizing the light conversion structure for maximum efficiency, allowing lower voltage operation by using the techniques previously described can reduce noise effects.

Figure 6:
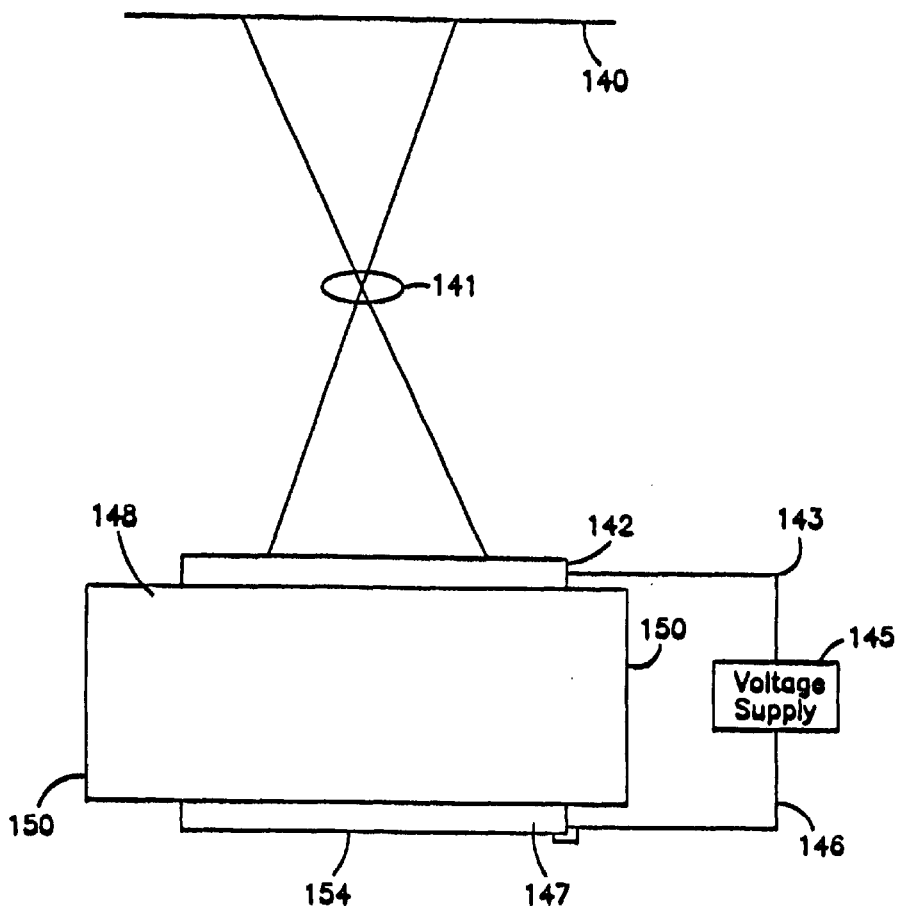

Referring now to FIG. 6 there is shown an illustration of a camera in accordance with this invention intended to be illustrative of any number of different imaging systems. In this figure, 140 represents an image which is focused through lens 141 onto photocathode 142. There is connected to photocathode 142 a voltage lead 143 from voltage source 145. Voltage source 145 is also connected through lead 146 to CMOS image sensor 147. A vacuum chamber 148 separates photocathode 142 from CMOS image sensor 147. Walls 150 indicate the outer sealed walls of the chamber.

The camera arrangement shown in this figure is intended to illustrate a system useful in connection with this invention. What should be readily appreciated is the camera system may take many forms and may be modified as is known in the art for a particular application. Thus in a surveillance system, the image being captured may comprise the inside or the outside of a building area with the camera lens focusing images onto the photocathode which in turn in space wise configuration transfers the image to the CMOS image sensor which in turn may feed an output cathode ray system or alternate display for viewing of the image. As will be readily apparent, the image 140 may be viewed at a remote location or on a display integrated in the system to which the output of the passive pixel sensor is fed. Such a screen may located as shown at 154 as the output of the system.

A camera of the type illustrated is capable of imaging and reproducing images working at light levels as low as starlight but typically and preferably will be operated in brighter surroundings but such surroundings may be without adequate light for normal passage of persons at nighttime. This generally is more than adequate for most systems and needs and thus permits the setting of lower standards for certain components used in the system. In the case of applications demanding the full capability of low light level imaging such as for night vision purposes such as for helicopter applications where flying may be very low and concern may exist about accidents with either high buildings or trees or power wires, the system would be designed as illustrated and may include some of the unique approaches followed for night vision devices such as battery operations, helmet arrangements and the like.

In some scientific applications it is necessary to work in extremely dark conditions. Yet it is necessary for personnel to handle items without breakage. Night vision adjusted systems are most useful for these purposes. Other scientific applications require the ability to image light emission at very low levels or even to detect single photons. The described system is suitable for these applications.

While this invention has been described in terms of specific embodiments, it should be understood that there are various alternatives that may be employed in practicing this invention which will be apparent to those skilled in the art. It is therefore intended to broadly define this invention in terms of the following claims.

What is claimed is:

1. A low light imaging system comprising
a photocathode sensor within a vacuum envelope,
a passive pixel CMOS chip imager within the vacuum envelope in a facing relationship to said photocathode sensor, and
an electron transfer system to cause electrons emitted by said photocathode sensor in response to a light input image to migrate through said vacuum envelope and bombard said passive pixel CMOS chip as to form an electronic image of said input low light image.

2. A low light imaging system in accordance with claim 1 in which said photocathode sensor is at a surface wall of said vacuum envelope on a transparent support base and said input image travels through said transparent base to said photocathode.

3. A low light imaging system in accordance with claim 2 in which said electronic image is fed from said passive pixel sensor chip out of said vacuum envelope to electronic processing circuits to form a viewable image.

4. A low light imaging system in accordance with claim 1 in which said photocathode comprises a III–V semiconductor photocathode.

5. A low light imaging system in accordance with claim 4 in which said III–V photocathode comprises GaAs.

6. A low light imaging system in accordance with claim 4 in which said III–V photocathode comprises an InP/InGaAs transferred electron photocathode.

7. A low light imaging system in accordance with claim 1 in which said photocathode comprises a multi-alkali photocathode.

8. A low light imaging system in accordance with claim 1 in which said electronic transfer system includes said photocathode at a negative acceleration voltage with respect to said imager.

9. A low light imaging system in accordance with claim 8 in which said imager is biased to substantially ground potential.

10. A low light imaging system in accordance with claim 1 in which the front side of said CMOS chip is in facing relationship with the surface of said photocathode emitting electrons.

11. A low light imaging system in accordance with claim 10 in which the photodiode of said CMOS chip is at the front side of said chip and in which the fill factor of the photodiode of said passive pixel sensors comprises a substantial percentage of the pixel area of said chip surface.

12. A low light imaging system in accordance with claim 1 in which the back side of said passive pixel sensor is electron bombarded by being positioned facing said photocathode and the fill factor comprises substantially 100 percent of the pixel area.

13. The low light imaging system in accordance with claim 1 in which said electron transfer system is within the vacuum envelope.

14. A low light level camera system comprising
a photocathode sensor within a vacuum envelope at a surface wall of said vacuum envelope on a transparent support base as to enable an input image to travel through said transparent base to said photocathode,
a lens to focus an incoming image onto said photocathode,
a passive pixel CMOS chip imager within the vacuum envelope in a facing relationship to said photocathode sensor.
an electron transfer system to apply voltage to said CMOS chip to cause electrons emitted by said photocathode sensor in response to a light input image to migrate through said vacuum envelope and bombard said CMOS chip as to form an electronic image of said input low light image, and
electronic circuitry to feed said electronic image from said CMOS chip out of said vacuum envelope to electronic processing circuits to form a viewable image.

15. A low light imaging system in accordance with claim 5 in which said CMOS imager is on a header assembly and video output signals are electrically fed through said header assembly out of said vacuum envelope.

16. The camera in accordance with claim 14 in which the passive pixel sensor is coated with an electron to light conversion layer and in which said conversion layer is positioned so that electrons released from said photocathode directly impinge onto said conversion layer.

17. The camera in accordance with claim 16 in which a shield layer is positioned on said electron to light conversion layer to block light generated by the layer reaching the photocathode.

18. A method of recording low light level images comprising projecting an input image to be recorded onto a photocathode to cause said photocathode to release electrons in a spatial configuration into a vacuum chamber conforming to an input image to bombard a receiving plane, positioning a passive pixel sensor CMOS imaging chip at a receiving plane of the electron image within the vacuum chamber, and
directing the output of said passive pixel sensor out of said vacuum to a recording device.

19. A night vision system comprising
a vacuum envelope,
a passive pixel CMOS sensor positioned in said vacuum envelope,
a photocathode to generate an electronic image within said vacuum envelope conforming to incoming light information,
transfer fields within said vacuum envelope to cause said electronic image to bombard said passive pixel CMOS sensor to thereby generate electronic information, and
feed means to transfer the electronic information out of said vacuum envelope.

20. A method to record low light level images comprising
projecting an input image to be recorded onto a photocathode to cause said photocathode to release electrons in a spatial configuration into a vacuum chamber conforming to the input image,
positioning a passive pixel sensor CMOS imager at a receiving plane of the electron image within the vacuum chamber,
creating a electron driving field from the photocathode to the passive pixel sensor of the CMOS imager to cause electrons to bombard the passive pixel sensor within the vacuum chamber, and
directing the output of said active pixel sensor out of said vacuum chamber.

21. The method of claim 20 including directing the output to a video display.

22. The method of claim 20 including recording the output at the video display.

23. The method of claim 20 including positioning the front side of the passive pixel sensor CMOS imager facing the photocathode so that electrons travelling from said photocathode to said passive pixel sensor bombard the front surface of said passive pixel sensor CMOS imager.

24. The method of claim 23 in which one transistor is used per pixel.

25. The method of claim 20 positioning the back side of the passive pixel sensor CMOS imager facing the photocathode so that electrons travelling from said photocathode to said passive pixel sensor bombard the back surface of said passive pixel sensor CMOS imager.

26. The method of claim 20 in which the photocathode comprises a semiconductor III–V material.

27. The method of claim 26 in which said semiconductor comprises InP/InGaAs.

28. The method of claim 20 in which said photocathode comprises a multi-alkali.

29. The method of claim 21 in which electrons are caused to bombard the passive pixel sensor CMOS imager by creating a voltage difference which results in an electron bombarded gain which is greater than or equal to the read noise but lower than about 2,000 volts between said photocathode and said passive pixel sensor CMOS imager.

30. The method of claim 29 in which said passive pixel sensor is maintained at approximately ground potential and said photocathode is at a negative potential.

* * * * *